United States Patent [19]

Heidtmann et al.

[11] Patent Number: 4,928,003
[45] Date of Patent: May 22, 1990

[54] CHARGE-COUPLED DEVICE FOR DETECTING SPATIAL VARIATION IN THE INTENSITY OF ELECTROMAGNETIC RADIATION

[75] Inventors: Denis L. Heidtmann, Portland; Morley M. Blouke, Beaverton, both of Oreg.

[73] Assignee: Tektronix, Inc., Beaverton, Oreg.

[21] Appl. No.: 219,954

[22] Filed: Jul. 15, 1988

[51] Int. Cl.$^5$ ............................................. H01L 27/14
[52] U.S. Cl. .................................. 250/211 J; 357/24; 377/63
[58] Field of Search ................ 250/211 J, 211 R, 578; 357/24 LR, 30 D, 30 G, 30 H, 30 Q, 30 R; 377/60–63

[56] References Cited

U.S. PATENT DOCUMENTS 4,366,550 12/1982 Lampe ................................... 377/63
4,389,661  6/1983 Yamada ................................. 377/63
4,780,765 10/1988 Hamasaki et al. ............. 357/24 LR Primary Examiner—Edward P. Westin
Attorney, Agent, or Firm—John D. Winkelman; John Smith-Hill

[57] ABSTRACT

A charge-coupled device for detecting spatial variation in the intensity of electromagnetic radiation comprises a body of semiconductor material that responds to electromagnetic radiation in a given spectral region by generating charge carriers. The body of semiconductor material has first and second sense volumes that are isolated from each other with respect to diffusion of charge carriers. A sense electrode structure overlies the sense volumes. First and second transfer regions are in communication with the first and second sense volumes respectively, and a transfer electrode structure overlies the transfer regions. A readout region has first and second zones in communication with the first and second transfer regions respectively and is connected to an output node. Charge can be accumulated in the sense volumes over an integration period and the resulting charge samples can be shifted separately through the transfer regions and applied to the output node.

24 Claims, 3 Drawing Sheets

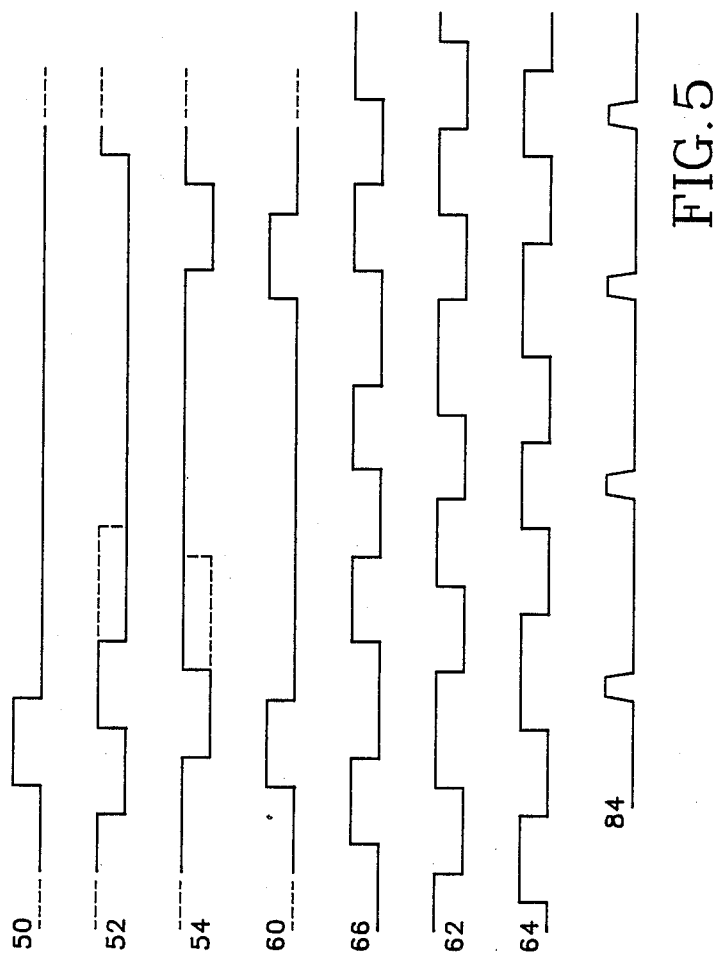

CHARGE-COUPLED DEVICE FOR DETECTING SPATIAL VARIATION IN THE INTENSITY OF ELECTROMAGNETIC RADIATION

BACKGROUND OF THE INVENTION

This invention relates to a charge-coupled device (CCD) for detecting spatial variation in the intensity of electromagnetic radiation.

A quadrant detector that comprises four photodiodes, equiangularly distributed about a central axis, may be used for positioning an object relative to a light source. The quadrant detector is mounted on the object so when the object is in the desired orientation, the light source is imaged on the detector and the four diodes provide equal currents. If the orientation of the object changes, at least two of the photocurrents will be different from each other and the resulting error signal may be used in a feedback loop to adjust the orientation of the object in a manner such as to achieve equality of the four photocurrents.

Conventional quadrant detectors of this kind are not suitable for positioning an object relative to a faint light source. For example, such a quadrant detector could not readily be used to position a spacecraft relative to a star. The reason for this is that the energy flux received by the detector is so small that the photocurrents provided by the four diodes are subject to substantial and essentially random variations in relative magnitude, and therefore the instantaneous value of an error signal is not a reliable indication of the error in orientation of the spacecraft.

It is known to use an imaging CCD to generate an electrical signal representative of the intensity with which light is incident on the device. One form of imaging CCD comprises a silicon die that has been processed using conventional MOS technology to form a buried channel beneath its front surface (the surface through which the die is processed). Charges are generated within the die photoelectrically. Thus, if photons enter the die, conduction electrons may be generated and these conduction electrons may enter the buried channel. By controlling clock signals that are applied to a gate electrode structure of the CCD, the charge that enters the buried channel may be confined in the channel for a substantial period. Accumulated charge may be extracted from the buried channel by application of suitable clock signals to the gate electrode structure.

SUMMARY OF THE INVENTION

A preferred embodiment of the invention is a charge-coupled device for detecting spatial variation in the intensity of electromagnetic radiation. The device comprises a body of semiconductor material that responds to electromagnetic radiation in a given spectral region by generating charge carriers. The body of semiconductor material has first and second sense volumes that are isolated from each other with respect to diffusion of charge carriers. A sense electrode structure lies over the sense regions. First and second transfer regions are in communication with the first and second sense volumes respectively, and a transfer electrode structure overlies the transfer regions. A readout region has first and second zone in communication with the first and second transfer regions respectively and is connected to an output node. Charge ca be accumulated in the sense volumes over an integration period and the resulting charge samples shifted separately through the transfer regions and applied to the output node.

BRIEF DESCRIPTION OF THE DRAWINGS

For a better understanding of the invention, and to show how the same may be carried into effect, reference will now be made, by way of example, to the accompanying drawings in which:

FIG. 5 illustrates the waveforms of signals that are applied to electrodes of the device illustrated in FIGS. 2–4.

DETAILED DESCRIPTION p FIG. 1 illustrates a single monocrystalline die 2 of p-type silicon. Since the die is monocrystalline, the crystal planes at any region of the die are parallel to or coplanar with the crystal planes at every other region of the die. In a first implantation, a p-type impurity is introduced into the regions 4 and 6 of the die through its front surface. The regions 4 and 6 are then of p+ conductivity. After the p-type implantation, a thick layer 7 (FIG. 3) of silicon dioxide is thermally grown over the field area of the die (the area outside what will ultimately be the active device area), over the region 6. In a second implantation, an n-type impurity is introduced into the regions 8, 10, 12, and 14 of the active area, giving those regions n conductivity. The region 8 is the buried channel region of the device and comprises two sensing zones 16 and 18, two transfer zones 20 and 22, and a readout zone 24. The zones 16 and 20 are separated from the zones 18 and 22 respectively by a zone 26 which is of p conductivity. The region 10 is an output transistor region, and the regions 12 and 14 are dummy channel regions extending around the buried channel region 8 and the output transistor region 10 respectively.

A thin layer 30 (FIG. 3) of silicon dioxide is formed over the front surface of the die, and polysilicon electrodes are formed on top of the layer 30 over the regions 4, 8 and 12. As shown in FIG. 2, the polysilicon electrodes 50, 52 and 54 overlie the sensing zones 16 and 18. The electrode 52 is in two parts 52a and 52b, and similarly the electrode 54 is in two parts 54a and 54b. A polysilicon transfer electrode 60 overlies the transfer zone, and three polysilicon readout electrodes 62, 64 and 66 overlie the regions 12 and 24. The electrodes 62 and 64 are each in four parts and the electrode 66 is in three parts. A polysilicon last gate 82 is formed over the regions 12 and 24, and a polysilicon reset gate 84 is formed over the region 8. The polysilicon electrodes are formed in successive stages, and the electrodes formed in later stages would normally overlap those formed in earlier stages instead of being coplanar as shown in FIG. 4. A potential well is defined in the buried channel region beneath each electrode, with the energetic depth of a potential well depending on the potential of the electrode.

Figure 1:
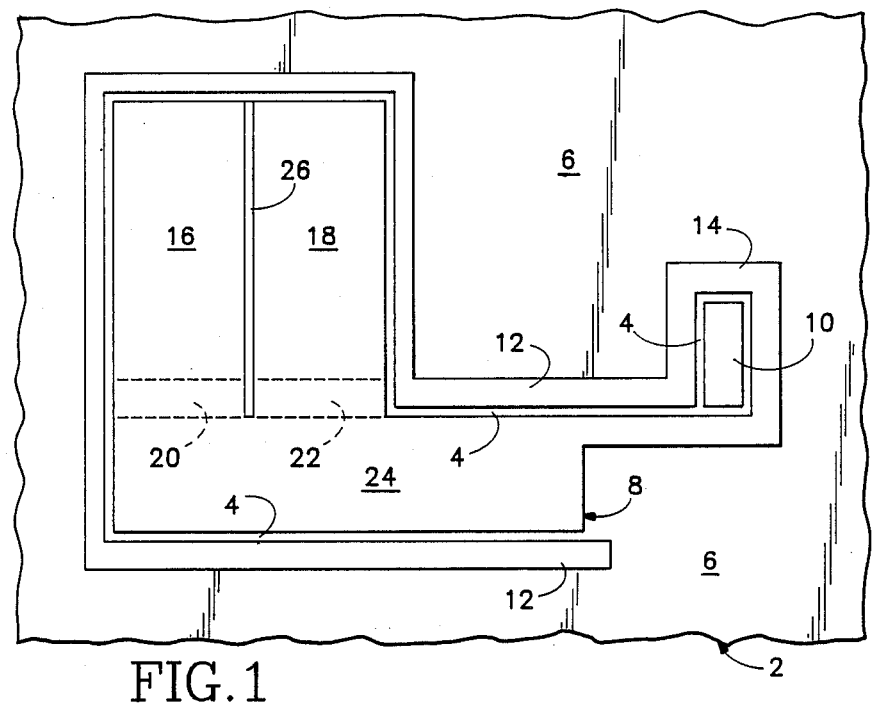
FIG. 1 is a schematic top plan view of a die of semiconductor material that is used in fabricating a charge-coupled device embodying the present invention.

After the polysilicon electrodes have been formed, the thin oxide layer 30 is partially removed, exposing the die, and an open tube diffusion then takes place. In the open tube diffusion, n-type impurity ions are introduced into the parts of the readout zone that have been exposed by removal of the layer 30. In this manner, an n+ floating diffusion 72 and an n+ output diffusion 74 (FIG. 4) are formed in the readout zone.

The illustrated device is used to generate electrical signals representative of the optical energy incident on the sensing zones through the front surface of the die during an integration period. Light incident on the sensing zones can enter the die and may cause conduction electrons to be generated therein. The p+ region 4 and p zone 26 serve as channel stops, which prevent electrons in the sensing and transfer zones from diffusing out of the sensing and transfer zones except into the readout zone. A layer 68 of metal, such as aluminum, is provided over the major parts of the dummy channel region 12, the readout zone 24 and the transfer zones 20 and 22 in order to prevent stray light from entering the die and generating spurious charges that might impair the accuracy of the output signals. The layer 68 extends at least partially over the polysilicon electrodes, and a layer 70 (FIG. 4) of silicon dioxide prevents the layer 68 from establishing electrical connections among the polysilicon electrodes.

Metal contacts 76 and 78 are applied to the diffusions 72 and 74 respectively. The contact 76 is connected to the gate of an output transistor 80, which is formed in the region 10 and is shown schematically in FIG. 2. The source and drain electrodes of the transistor 80 are connected to respective bonding pads (not shown). The contact 78 is connected to the dummy channel region 12 and to a bonding pad (not shown).

In operation of the device, light is incident on the sensing zones during an integration period. During this integration period, the electrodes 52 and 54 are held high and the transfer electrode 60 and the electrode 50 are held low so that electrons that enter the potential wells beneath the electrode parts 52a and 52b or 54a and 54b are unable to leave those wells. Accordingly, two charge samples Q1 and Q2 are collected in the sensing zone 16, beneath the electrode parts 52a, 54a and the electrode parts 52b, 54b respectively, and two charge samples Q3 and Q4 are collected in the sensing zone 18, beneath the electrode parts 52a, 54a and the electrode parts 52b, 54b respectively.

At the end of the integration period, the electrode 52 goes low, and charge present in the wells under the electrode parts 52a and 52b is driven into the wells under the electrode parts 54a and 54b respectively, so that the charge samples Q1 and Q2 are confined in the wells defined in the zone 16 beneath the electrode parts 54a and 54b respectively and the samples Q3 and Q4 are confined in the wells defined in the zone 18 beneath the electrode parts 54a and 54b respectively.

The electrodes 50 and 60 then go high and the electrode 54 goes low, and accordingly the charge samples Q1 and Q3 are shifted into the wells in the zones 16 and 18 under the electrode 50 and the charge samples Q2 and Q4 are shifted into the transfer zones 20 and 22. When the electrode 60 subsequently goes low, the electrode 66 also is low and the electrodes 62 and 64 are high. Therefore, the charge sample Q2 enters the readout zone under the electrode parts 62a and 64a, and the charge sample Q4 enters the readout zone under the electrode parts 62b and 64b. The electrode 62 subsequently goes low, and therefore the charge present under the electrode parts 62a and 62b is displaced to the wells beneath the electrode parts 64a and 64b, respectively, so that the charge samples Q2 and Q4 are held in these wells respectively. The electrodes 62, 64 and 66 are clocked, advancing these charge samples through the readout zone in well-understood fashion towards the last gate.

When the charge samples Q2 and Q4 were transferred to the readout zone, by clocking the electrode 60 negative, the charge samples Q1 and Q3 beneath the electrode 50 were transferred to the wells beneath the electrode part 52b. These charge samples are clocked through the zones 16 and 18 into the transfer zones and enter the readout region. When the two samples Q1 and Q3 enter the readout zone, there are four charge samples in the readout zone, and these four samples are clocked out sequentially and are applied to the gate of the output field effect transistor 80. When the third and fourth samples enter the readout zone, at which time the electrodes 50 and 60 are low, a new integration period starts.

The reset gate operates in well understood fashion to bring the floating diffusion to the same potential as the output diffusion just before a charge sample is applied to the floating diffusion.

The dummy channel regions 12 and 14 trap electrons that diffuse towards the regions 8 and 10 from the field area of the die. Since the polysilicon electrodes overlie the region 12, these electrons are clocked through the region 12 as the charge samples Q1-Q4 are clocked through the region 8 and are drained by way of the bonding pad connected to the contact 78. The dummy channel regions thus serve as charge drain regions.

Figure 2:
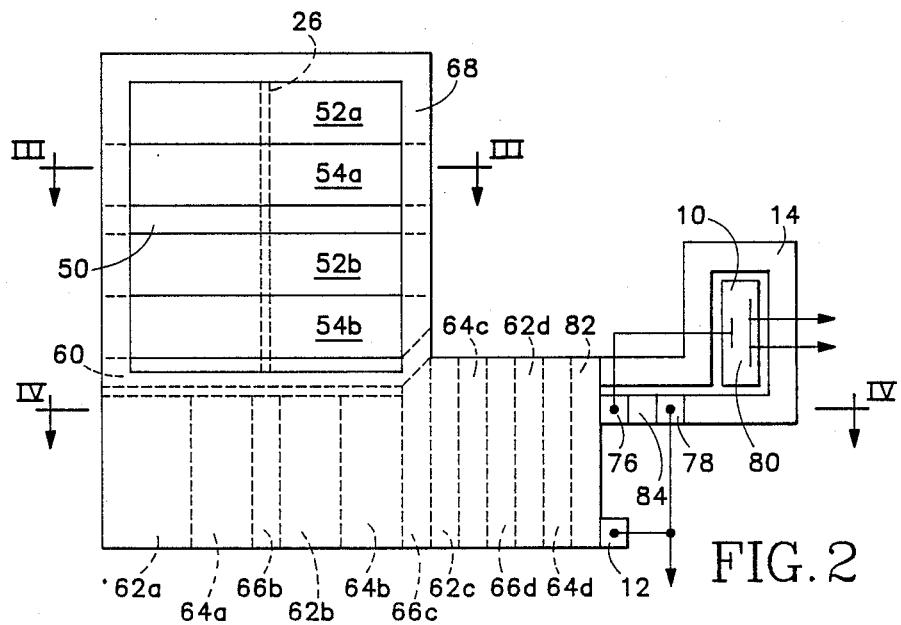
FIG. 2 is a similar view of the completed charge-coupled device.
Figure 3:
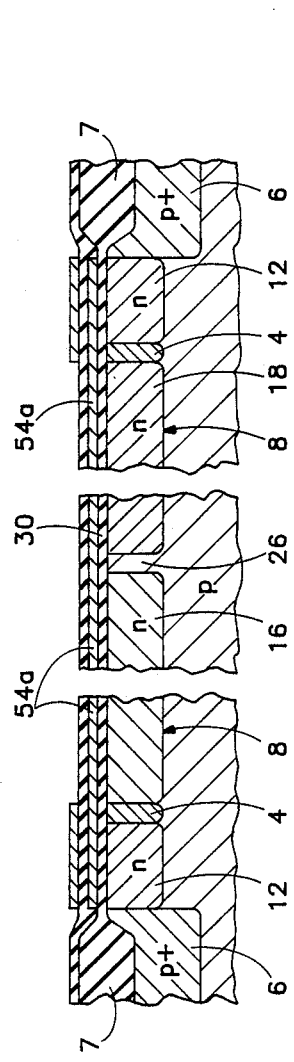
FIG. 3 is a partial sectional view, to an enlarged scale, taken on the line III—III of FIG. 2.
Figure 4:
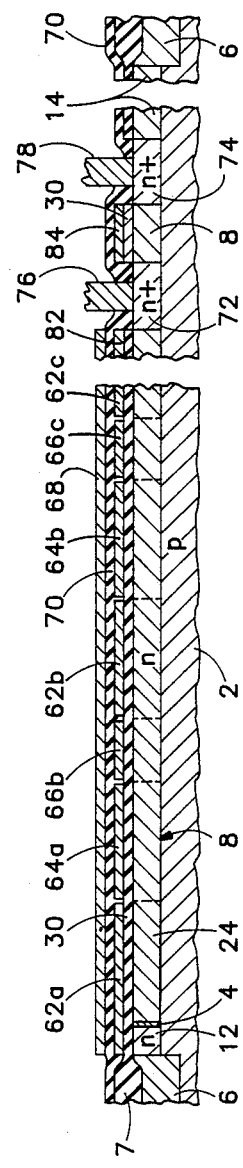
FIG. 4 is a partial sectional view taken on the line IV—IV of FIG. 2.

The device illustrated in FIGS. 2-4 may be used with a shutter (not shown) to control the integration period. When the shutter is opened, the integration period starts, and the samples Q1-Q4 are accumulated. When the shutter is closed, integration ends and readout commences. If no shutter is used, charge accumulates in the sensing zones even during the readout period. In order to minimize smearing of the samples, it is desirable that the readout take place rapidly. Since the charge samples are shifted into the readout zone in pairs, the readout speed is not limited by the need to apply the charge samples to the output transistor sequentially.

Attention is directed to U.S. patent application Ser. No. 07/219,024, filed concurrently herewith, which also discloses a device for detecting spatial variation in the intensity of electromagnetic radiation.

It will be appreciated that the present invention is not restricted to the particular embodiment that has been described and illustrated and that variations may be made therein without departing from the scope of the invention as defined in the appended claims and equivalents thereof.

We claim:

1. A charge-coupled device for detecting spatial variation in the intensity of electromagnetic radiation in a given spectral region, comprising:

a body of semiconductor material that responds to electromagnetic radiation in said given spectral region by generating charge carriers, the body of semiconductor material having first and second sense volumes that are isolated from each other with respect to diffusion of charge carriers, first and second transfer regions in communication with the first and second sense volumes respectively, and a readout region having first and second zones in communication with the first and second transfer regions respectively and being connected to an output node, a sense electrode structure that overlies the sense volumes and comprises at least first, second and third electrode parts each extending over both the first and second sense volumes with the second electrode part between the first and third electrode parts, so that the second electrode part can establish a potential barrier in each of the sense volumes between the region that lies under the first electrode part and the region that lies under the third electrode part, and a transfer electrode structure that overlies the transfer regions, whereby charge can be accumulated in the sense volumes over an integration period and the resulting charge samples can be shifted separately through the transfer regions and applied to the output node.

2. A device according to claim 1, wherein the first and second sense volumes are of a first conductivity type and are isolated from each other by a barrier region of a second, opposite conductivity type.

3. A device according to claim 1, wherein the first and second sense volumes and the first and second transfer regions are each of a first conductivity type, and the first sense volume and the first transfer region are separated from the second sense volume and the second transfer region by a barrier region of a second, opposite conductivity type.

4. A device according to claim 1, wherein the second electrode part is shorter, in the direction of diffusion of charge through the sense volumes, than the first and third electrode parts.

5. A device according to claim 1, wherein the transfer regions are adjacent one another and are of a first conductivity type and are isolated from each other with respect to diffusion of charge carriers by a barrier region of a second, opposite conductivity type.

6. A device according to claim 5, wherein the transfer electrode structure comprises a single electrode which overlies the first and second transfer regions.

7. A device according to claim 1, comprising a layer of material over the readout region, the material of said layer being substantially opaque to electromagnetic radiation in said given spectral region.

8. A device according to claim 1, wherein the sense volumes are at least partially surrounded by a charge drain region of the same conductivity type as the sense volumes, and the sense electrode structure overlies the charge drain region, whereby clocking of the sense electrode structure to cause charge samples to be shifted through the sense volumes and into the transfer regions causes charge in the charge drain region to be shifted through the charge drain region.

9. A charge-coupled device for detecting spatial variation in the intensity of electromagnetic radiation in a given spectral region, comprising:

a body of semiconductor material that responds to electromagnetic radiation in said given spectral region by generating charge carriers, the body of semiconductor material having first and second sense volumes that are isolated from each other with respect to diffusion of charge carriers, first and second transfer regions in communication with the first and second sense volumes respectively, and a readout region having first and second zones in communication with the first and second transfer regions respectively and being connected to an output node, a sense electrode structure that overlies the sense volumes, a transfer electrode structure that overlies the transfer regions, and a readout electrode structure that comprises at least a first readout electrode having parts the overlie the first and second zones respectively of the readout region, and a second readout electrode that overlies a zone between the first and second zones, whereby charge can be accumulated in the sense volumes over an integration period and the resulting charge samples can be shifted separately through the transfer regions and the readout region and applied to the output node.

10. A device according to claim 9, wherein the second readout electrode is shorter, in the direction of diffusion of charge through the readout region, than the parts of the first readout electrode.

11. A device according to claim 9, wherein the readout region comprises at least third and fourth zones between the first and second zones and the output node, said first readout electrode having parts that overlie the third and fourth zones respectively.

12. A device according to claim 11, wherein the parts of the first readout electrode that overlie the third and fourth zones of the readout region are shorter, in the direction of diffusion of charge through the readout region, than the parts of the first readout electrode that overlie the first and second zones of the readout region.

13. A device according to claim 9, comprising a layer of material over the readout region, the material of said layer being substantially opaque to electromagnetic radiation in said given spectral region.

14. A charge-coupled device for detecting spatial variation in the intensity of electromagnetic radiation in a given spectral region, comprising:

a body of semiconductor material that responds to electromagnetic radiation in said given spectral region by generating charge carriers, the body of semiconductor material having first and second sense volumes that are isolated from each other with respect to diffusion of charge carriers, first and second transfer regions in communication with the first and second sense volumes respectively, and a readout region having first and second zones in communication with the first and second transfer regions respectively and being connected to an output node.

a sense electrode structure that overlies the sense volumes, and a transfer electrode structure that overlies the transfer regions, whereby charge can be accumulated in the sense volumes over an integration period and the resulting charge samples can be shifted separately through the transfer regions and applied to the output node, and wherein the sense volumes are at least partially surrounded by a charge drain region of the same conductivity type as the sense volumes, and the sense electrode structure overlies the charge drain region, whereby clocking of the sense electrode structure to cause charge samples to be shifted through the sense volumes and into the transfer regions causes charge in the charge drain region to be shifted through the charge drain region.

15. A device according to claim 14, wherein the first and second sense volumes are of a first conductivity type and are isolated from each other by a barrier region of a second, opposite conductivity type.

16. A device according to claim 14, comprising a layer of material over the readout region, the material of said layer being substantially opaque to electromagnetic radiation in said given spectral region.

17. A charge-coupled device for detecting spatial variation in the intensity of electromagnetic radiation in a given spectral region, comprising:
a body of semiconductor material that responds to electromagnetic radiation in said given spectral region by generating charge carriers, the body of semiconductor material having first and second sense volumes that are isolated from each other with respect to diffusion of charge carriers, first and second transfer regions in communication with the first and second sense volumes respectively, and a readout region having first and second zones in communication with the first and second transfer regions respectively and being connected to an output node,
a transfer electrode structure that overlies the transfer regions, and
a sense electrode structure that overlies the sense volumes and comprises first and second electrodes each having two parts that each overlie both the first and second sense volumes, and a third electrode that overlies the first and second sense volumes, one part of the first electrode being between one part of the second electrode and the third electrode, the other part of the first electrode being between the third electrode and the transfer electrode structure, and the other part of the second electrode being between said other part of the first electrode and the third electrode, whereby the third electrode can establish a potential barrier in each of the sense volumes between the region that lies under said one part of the first electrode and said one part of the second electrode and the region that lies under said other part of the first electrode said other part of the second electrode,
whereby charge can be accumulated in the sense volumes over an integration period and the resulting charge samples can be shifted separately through the transfer regions and applied to the output node.

18. A device according to claim 17, wherein the first and second sense volumes are of a first conductivity type and are isolated from each other by a barrier region of a second, opposite conductivity type.

19. A device according to claim 17, wherein the third electrode is shorter, in the direction of diffusion of charge through the sense volume, than the parts of the first and second electrodes.

20. A device according to claim 17, wherein the transfer regions are adjacent one another and are of a first conductivity type and are isolated from each other with respect to diffusion of charge carriers by a barrier region of a second, opposite conductivity type.

21. A device according to claim 20, wherein the transfer electrode structure comprises a single electrode that overlies the first and second transfer regions.

22. A device according to claim 17, comprising a layer of material over the readout region, the material of said layer being substantially opaque to electromagnetic radiation in said given spectral region.

23. A device according to claim 17, wherein the sense volumes are at least partially surrounded by a charge drain region of the same conductivity type as the sense volumes, and the sense electrode structure overlies the charge drain region, whereby clocking of the sense electrode structure to cause charge samples to be shifted through the sense volumes and into the transfer regions causes charge in the charge drain region to be shifted through the charge drain region.

24. A device according to claim 17, wherein the first and second sense volumes and the first and second transfer regions are each of a first conductivity type, and the first sense volume and the first transfer region are separated from the second sense volume and the second transfer region by a barrier region of a second, opposite conductivity type.

* * * * *